(12) United States Patent
Kubo

(10) Patent No.: US 10,481,476 B2
(45) Date of Patent: Nov. 19, 2019

(54) IMAGE PROCESSING APPARATUS, IMAGE PROCESSING METHOD, AND STORAGE MEDIUM

(71) Applicant: CANON KABUSHIKI KAISHA, Tokyo (JP)

(72) Inventor: Hideki Kubo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 133 days.

(21) Appl. No.: 15/627,988

(22) Filed: Jun. 20, 2017

(65) Prior Publication Data

US 2018/0004075 A1  Jan. 4, 2018

(30) Foreign Application Priority Data

Jun. 30, 2016  (JP) .................................. 2016-130607
Mar. 15, 2017  (JP) .................................. 2017-050377

(51) Int. Cl.
| | |
|---|---|
| G02B 26/00 | (2006.01) |
| G02B 26/08 | (2006.01) |
| G02F 1/29 | (2006.01) |
| G03B 21/20 | (2006.01) |
| H04N 9/31 | (2006.01) |
| G03F 7/20 | (2006.01) |
| H04N 1/00 | (2006.01) |

(52) U.S. Cl.
CPC ......... *G03B 21/208* (2013.01); *G03F 7/2018* (2013.01); *H04N 1/00236* (2013.01); *H04N 9/3147* (2013.01); *G03B 2205/0023* (2013.01)

(58) Field of Classification Search
CPC .......... G03B 21/208; G03B 2205/0023; G05B 2219/49023
USPC ......... 359/237, 242, 265–267, 290–292, 298
See application file for complete search history.

(56) References Cited

U.S. PATENT DOCUMENTS

2018/0004074 A1\* 1/2018 Kubo .................. G03B 21/208

FOREIGN PATENT DOCUMENTS

JP          3555420 B2     8/2004

\* cited by examiner

*Primary Examiner* — Brandi N Thomas
(74) *Attorney, Agent, or Firm* — Canon U.S.A., Inc. I.P. Division

(57) ABSTRACT

An image processing apparatus is provided for generating data used to form on a recording medium an uneven layer on which a plurality of unit areas each having a projection are arranged, including: a first obtaining unit that obtains first brightness information regarding a brightness of a predetermined area of an object observed in a first viewing direction and a brightness of the predetermined area of the object observed in a second viewing direction having an elevation angle different from that of the first viewing direction; and a first generation unit that generates first recording amount data that indicates a recording amount of recording material used to form the uneven layer on the recording medium, the uneven layer being formed such that at least one of a width of each of the unit areas and a height of the projection changes, on a basis of the first brightness information.

19 Claims, 17 Drawing Sheets m-th MAIN SCAN (m+1)-th MAIN SCAN (m+2)-th MAIN SCAN

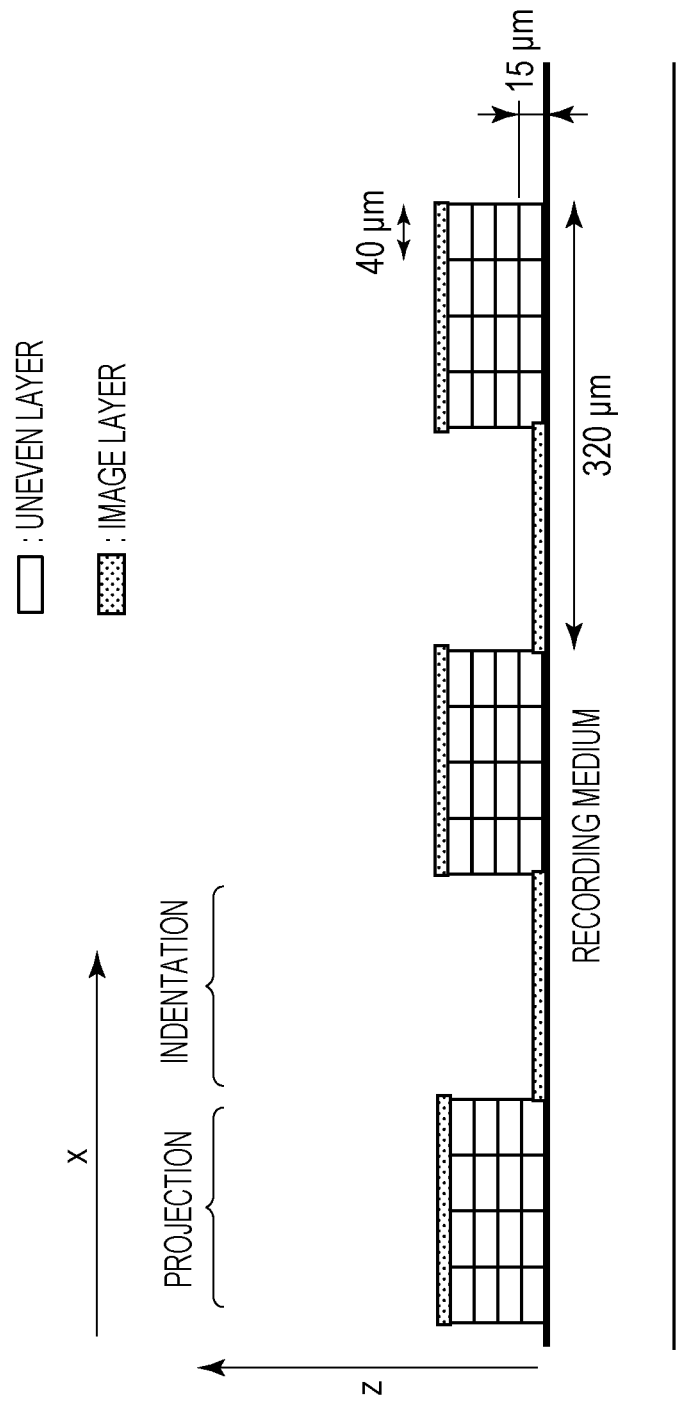

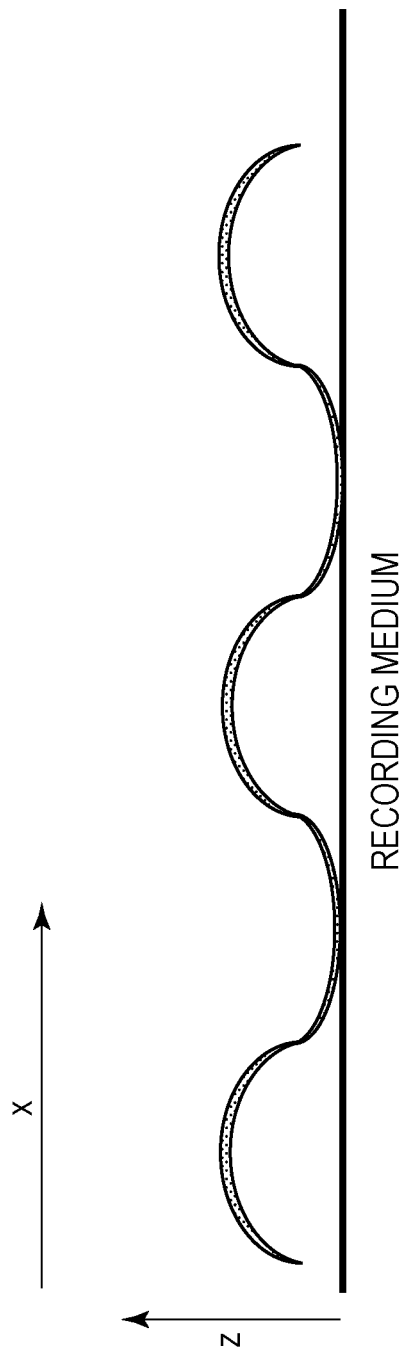

FIG. 11A

| $\Delta L'_{ave}$ | h/ws |
|---|---|
| -20 | 1/2 |
| -15 | 1/4 |
| -10 | 1/8 |
| -5 | 1/16 |
| 0 | 0 |

FIG. 11B

| $\Delta L\theta'_{ave}$ | w/d |
|---|---|
| 15 | 2/8 |
| 10 | 3/6 |
| 5 | 4/5 |
| 0 | 4/4 |
| -5 | 5/4 |
| -10 | 6/3 |
| -15 | 8/2 |

FIG. 11C

| $\Delta L\phi'_{ave}$ | A |
|---|---|
| -20 | 1/2 |
| -15 | 1/4 |
| -10 | 1/8 |
| -5 | 1/16 |
| 0 | 0 |

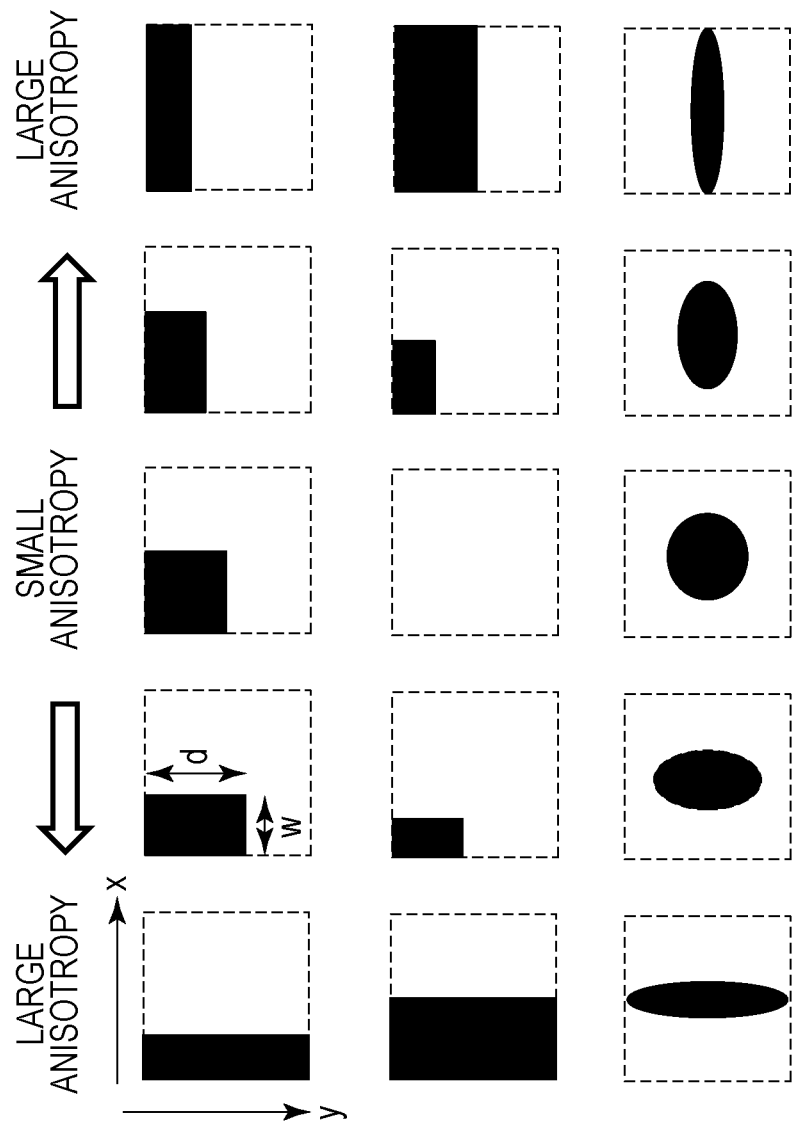

FIG. 13A h/ws = 1/8

| 266% | 266% | 266% | 266% | 0% | 0% | 0% | 0% |
|---|---|---|---|---|---|---|---|
| 266% | 266% | 266% | 266% | 0% | 0% | 0% | 0% |
| 266% | 266% | 266% | 266% | 0% | 0% | 0% | 0% |
| 266% | 266% | 266% | 266% | 0% | 0% | 0% | 0% |
| 266% | 266% | 266% | 266% | 0% | 0% | 0% | 0% |
| 266% | 266% | 266% | 266% | 0% | 0% | 0% | 0% |
| 266% | 266% | 266% | 266% | 0% | 0% | 0% | 0% |
| 266% | 266% | 266% | 266% | 0% | 0% | 0% | 0% |

FIG. 13B h/ws = 1/4

| 533% | 533% | 533% | 533% | 0% | 0% | 0% | 0% |
|---|---|---|---|---|---|---|---|
| 533% | 533% | 533% | 533% | 0% | 0% | 0% | 0% |
| 533% | 533% | 533% | 533% | 0% | 0% | 0% | 0% |
| 533% | 533% | 533% | 533% | 0% | 0% | 0% | 0% |
| 533% | 533% | 533% | 533% | 0% | 0% | 0% | 0% |
| 533% | 533% | 533% | 533% | 0% | 0% | 0% | 0% |
| 533% | 533% | 533% | 533% | 0% | 0% | 0% | 0% |
| 533% | 533% | 533% | 533% | 0% | 0% | 0% | 0% |

FIG. 15 h/ws = 1/8

θ'ave = −3° TO 3°

| 266% | 266% | 266% | 266% | 266% | 266% | 266% | 266% |
|------|------|------|------|------|------|------|------|
| 266% | 266% | 266% | 266% | 266% | 266% | 266% | 266% |
| 266% | 266% | 266% | 266% | 266% | 266% | 266% | 266% |
| 266% | 266% | 266% | 266% | 266% | 266% | 266% | 266% |
| 0%   | 0%   | 0%   | 0%   | 0%   | 0%   | 0%   | 0%   |
| 0%   | 0%   | 0%   | 0%   | 0%   | 0%   | 0%   | 0%   |
| 0%   | 0%   | 0%   | 0%   | 0%   | 0%   | 0%   | 0%   |
| 0%   | 0%   | 0%   | 0%   | 0%   | 0%   | 0%   | 0%   |

θ'ave = 4° TO 10°

| 266% | 266% | 266% | 266% | 0%   | 0%   | 0%   | 0%   |
|------|------|------|------|------|------|------|------|
| 266% | 266% | 266% | 266% | 266% | 266% | 266% | 266% |
| 266% | 266% | 266% | 266% | 266% | 266% | 266% | 266% |
| 266% | 266% | 266% | 266% | 266% | 266% | 266% | 266% |
| 0%   | 0%   | 0%   | 0%   | 266% | 266% | 266% | 266% |
| 0%   | 0%   | 0%   | 0%   | 0%   | 0%   | 0%   | 0%   |
| 0%   | 0%   | 0%   | 0%   | 0%   | 0%   | 0%   | 0%   |
| 0%   | 0%   | 0%   | 0%   | 0%   | 0%   | 0%   | 0%   |

θ'ave = 11° TO 16°

| 266% | 266% | 266% | 0%   | 0%   | 0%   | 0%   | 0%   |
|------|------|------|------|------|------|------|------|
| 266% | 266% | 266% | 266% | 266% | 266% | 0%   | 0%   |
| 266% | 266% | 266% | 266% | 266% | 266% | 266% | 266% |
| 266% | 266% | 266% | 266% | 266% | 266% | 266% | 266% |
| 0%   | 0%   | 0%   | 266% | 266% | 266% | 266% | 266% |
| 0%   | 0%   | 0%   | 0%   | 0%   | 0%   | 266% | 266% |
| 0%   | 0%   | 0%   | 0%   | 0%   | 0%   | 0%   | 0%   |
| 0%   | 0%   | 0%   | 0%   | 0%   | 0%   | 0%   | 0%   |

⋮

IMAGE PROCESSING APPARATUS, IMAGE PROCESSING METHOD, AND STORAGE MEDIUM

BACKGROUND OF THE INVENTION

Field of the Invention

The present disclosure relates to at least one embodiment of an image processing technique for outputting printed materials having brightness that changes when viewed from different angles.

Description of the Related Art

Some textiles, such as satin or embroidered textiles, and hairline-finish metal surfaces, for example, are anisotropic, that is, look significantly different when viewed from different angles due to the complex fine form of the surface thereof. Examples of printed materials that reproduce such anisotropy include printed materials created by using a lenticular lens. Japanese Patent No. 3555420 discloses a technique in which an ultraviolet (UV)-curing inkjet printer capable of forming projections and indentations with an ink that includes a photo-curable resin is used to allow an image and a lenticular lens that is overlaid on the image to be simultaneously formed.

However, in the method as described in Japanese Patent No. 3555420 in which a lenticular lens is used, an image needs to be printed at a high resolution in order to make the brightness and color smoothly change when the angle of view is changed. Further, it is difficult to precisely form a curved surface of the lens at a high resolution by using an inkjet printer.

SUMMARY OF THE INVENTION

The present disclosure provides image processing for obtaining anisotropic printed materials more easily than before.

In order to address the issue described above, at least one embodiment of an image processing apparatus according to an aspect of the present disclosure is an image processing apparatus for generating data used to form on a recording medium an uneven layer on which a plurality of unit areas each having a projection are arranged, the image processing apparatus including a first obtaining unit and a first generation unit. The first obtaining unit is configured to obtain first brightness information regarding a brightness of a predetermined area of an object observed in a first viewing direction and regarding a brightness of the predetermined area of the object observed in a second viewing direction, the second viewing direction being a direction having an elevation angle different from an elevation angle of the first viewing direction. The first generation unit is configured to generate first recording amount data that indicates a recording amount of recording material used to form the uneven layer on the recording medium, the uneven layer being formed such that at least one of a width of each of the unit areas and a height of the projection changes, on a basis of the first brightness information.

According to other aspects of the present disclosure, one or more additional image processing apparatuses, one or more image processing methods, and one or more storage mediums for use therewith are discussed herein. Further features of the present disclosure will become apparent from the following description of exemplary embodiments with reference to the attached drawings.

BRIEF DESCRIPTION OF THE DRAWINGS

FIG. 5 is a schematic diagram illustrating amount-of-ink data as a cross-sectional structure.

FIG. 6 is a schematic diagram illustrating a cross-sectional structure of a piece of formed printed material.

FIGS. 11A to 11C are diagrams illustrating example look-up tables (LUTs) that are referred to in one or more embodiments.

FIGS. 12A to 12C are diagrams for describing a relationship between w/d and a projection-indentation form.

FIGS. 13A and 13B are diagrams illustrating examples of amount-of-clear (CL)-ink data.

FIG. 15 includes schematic diagrams for describing a rotation process.

DESCRIPTION OF THE EMBODIMENTS

First Embodiment

In this embodiment, image data that includes color information indicating the color of an image and amount-of-brightness-change information regarding the amount of change in brightness when the angle of view related to the elevation angle direction is changed is obtained. Then, amount-of-colored-ink data (amount-of-colored-ink-recording data) and amount-of-CL-ink data (amount-of-CL-ink-recording data) are generated on the basis of the obtained image data.

Figure 1:
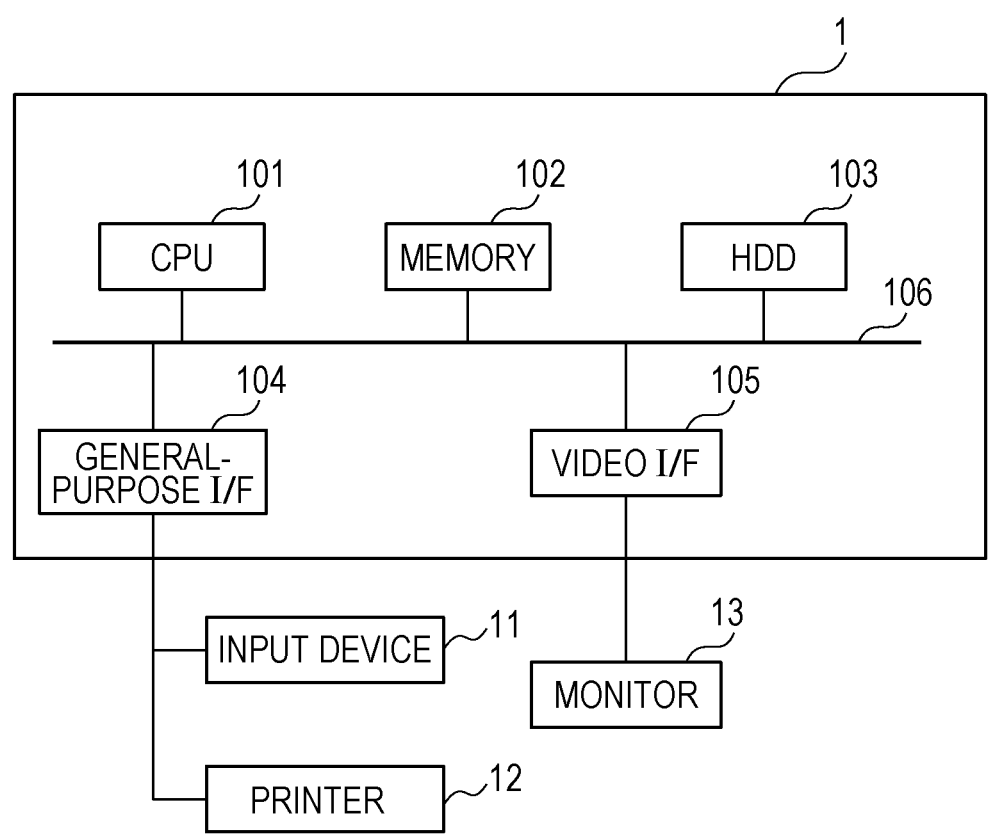
FIG. 1 is a block diagram illustrating an example hardware configuration of at least one embodiment of an image processing apparatus.

FIG. 1 is a block diagram illustrating an example hardware configuration of an image processing apparatus 1. In FIG. 1, the image processing apparatus 1 is, for example, a computer and includes a microprocessor (central processing unit (CPU)) 101 and a memory 102, such as a random access memory. The CPU 101 uses the memory 102 as a work memory and executes an operating system (OS) and various programs stored in a hard disk drive (HDD) 103 to control each constituent element via a system bus 106. To a general-purpose interface (I/F) 104, an input device 11, such as a mouse or a keyboard, and a printer 12 are connected. To a video I/F 105, a monitor 13 is connected. The CPU 101 controls the monitor 13 to display a user interface (UI) screen provided by a program and receives a user instruction via the input device 11.

Figure 2:
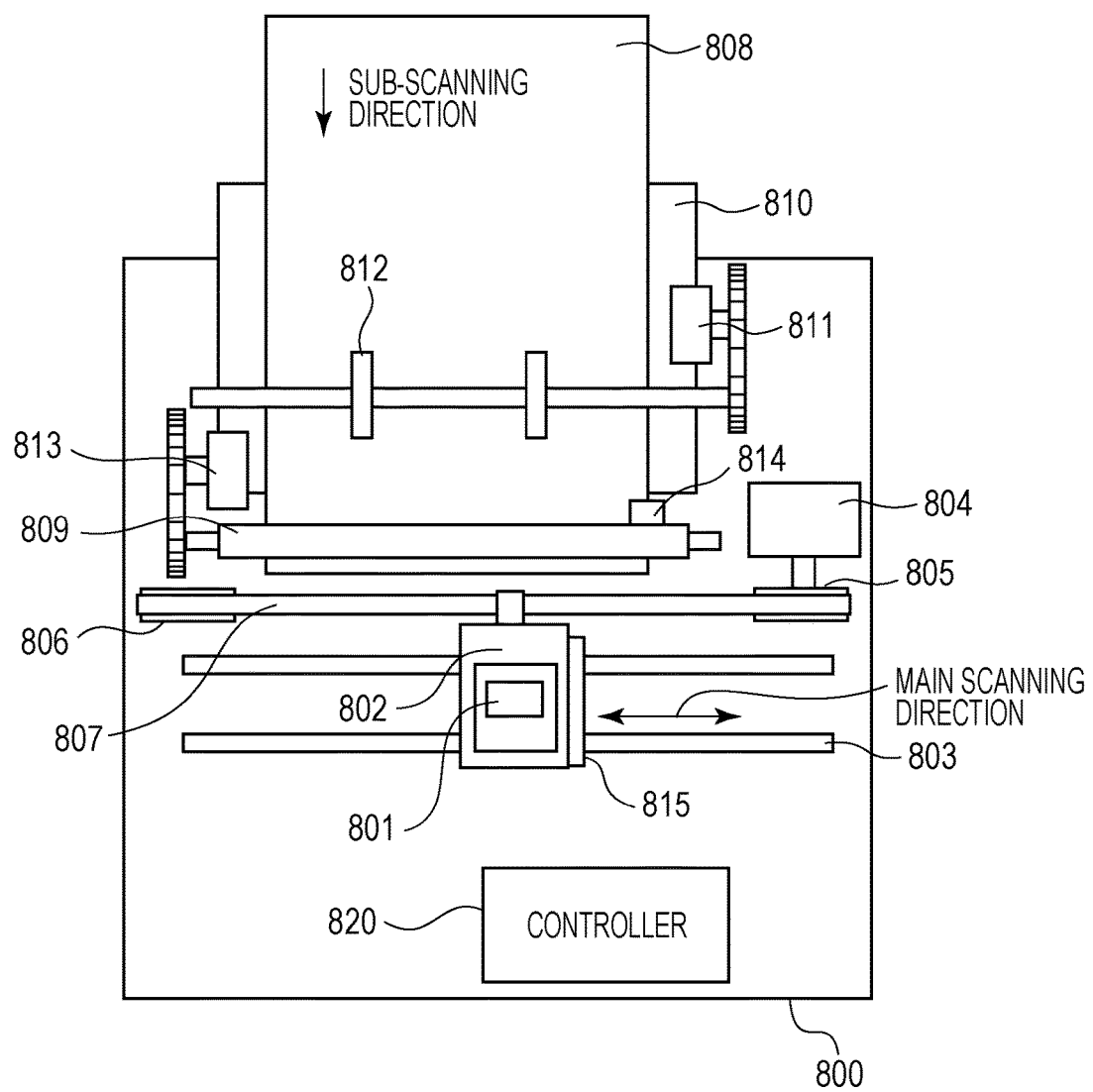
FIG. 2 is a block diagram illustrating an example configuration of a printer.

FIG. 2 is a block diagram of the printer 12. As the printer 12, an inkjet printer that forms projections and indentations and records colors by using inks is assumed. A head cartridge 801 includes a recording head having a plurality of discharge ports and ink tanks for supplying inks to the recording head, and is provided with a connector for receiving a signal, for example, for driving each of the discharge ports of the recording head. Hereinafter, a layer having projections and indentations and a color layer formed by using inks are respectively called an uneven layer and an image layer. In the ink tanks, five types of inks, namely, a CL ink for forming an uneven layer and colored inks, that is, cyan (C), magenta (M), yellow (Y), and black (K) inks, for forming an image layer are respectively stored. These inks are UV-curing inks that cure when irradiated with UV rays. The head cartridge 801 is mounted in a carriage 802 so as to be replaceable and is positioned by the carriage 802, and the carriage 802 is provided with a connector holder for transmitting a driving signal, for example, to the head cartridge 801 via the connector. A UV irradiation device 815 is mounted in the carriage 802 and is controlled so as to cure and fix a discharged ink onto a recording medium. The carriage 802 is capable of reciprocating along a guide shaft 803. Specifically, the carriage 802 is driven by a main scanning motor 804, which serves as a driving source, via a driving mechanism including a motor pulley 805, a driven pulley 806, and a timing belt 807, and the position and movement thereof are controlled. In this embodiment, movement of the carriage 802 along the guide shaft 803 is called "main scanning", and the movement direction is called "main scanning direction". Recording media 808, such as print sheets, are placed on an automatic sheet feeder (ASF) 810. In a case of image forming, a pick-up roller 812 is driven by a sheet-feed motor 811 via a gear and rotates, and the recording media 808 are separated one by one and fed from the ASF 810. A conveyance roller 809 rotates to convey each of the recording media 808 to a recording start position that faces the discharge-port surface of the head cartridge 801 in the carriage 802. The conveyance roller 809 is driven by a line-feed (LF) motor 813, which serves as a driving source, via a gear. Determination as to whether each of the recording media 808 has been fed and determination of the sheet-feed position are performed at a time point when the recording medium 808 passes a paper end sensor 814. The head cartridge 801 mounted in the carriage 802 is held such that the discharge-port surface thereof extends downward from the carriage 802 so as to be in parallel with the recording medium 808. A controller 820 is constituted by a CPU and a storage unit, for example, and controls operations of each component of the printer 12.

Now, operations performed by the printer 12 for forming an uneven layer and an image layer are described. First, when the recording medium 808 is conveyed to the recording start position for forming an uneven layer, the carriage 802 moves over the recording medium 808 along the guide shaft 803, and a CL ink is discharged from the discharge ports of the recording head during the movement. The UV irradiation device 815 emits UV rays simultaneously as the recording head moves to cure and fix the discharged CL ink onto the recording medium 808. When the carriage 802 moves up to one end of the guide shaft 803, the conveyance roller 809 rotates to convey the recording medium 808 in a direction perpendicular to the scanning direction of the carriage 802 by a predetermined distance. In this embodiment, such conveyance of the recording medium 808 is called "sheet conveyance" or "sub-scanning", and the conveyance direction is called "sheet-conveyance direction" or "sub-scanning direction". When the conveyance of the recording medium 808 by the predetermined distance ends, the carriage 802 moves again along the guide shaft 803. Scanning by the recording head of the carriage 802 and sheet conveyance are repeatedly performed as described above to thereby form an uneven layer on the entire recording medium 808. After the uneven layer has been formed, the conveyance roller 809 rotates to return the recording medium 808 to the recording start position, and the colored inks of cyan, magenta, yellow, and black are discharged to the uneven layer in a process similar to that for forming the uneven layer to form an image layer.

In order to simplify description, the recording head according to this embodiment is described under the assumption that the recording head is controlled in accordance with two values, namely, whether or not ink droplets are discharged. This applies to the CL ink and the colored inks. In this embodiment, control on whether or not ink droplets are discharged is performed for each pixel defined on the basis of the printer resolution of the printer 12, and a state where it is decided to discharge ink droplets to all pixels in a unit area is assumed to correspond to an amount of ink (recording amount) of 100%. Although a recording head for which the amount of discharged ink is variable is generally used, such a recording head can be used if the above-described two-value process is extended to a multi-value process having a plurality of variable levels, and the above-described process is not limited to the two-value process.

In formation of an uneven layer according to this embodiment, height control is performed for each position by using the idea of the amount of ink described above. In formation of an uneven layer, in a case of forming a substantially uniform layer with an amount of ink of 100%, the layer has a certain thickness (height) in accordance with the volume of the discharged ink. For example, in a case where a layer formed with an amount of ink of 100% has a thickness of 15 µm, five layers need to be overlaid for reproducing a thickness of 75 µm. That is, the amount of ink to be ejected to a position at which a height of 75 µm is required is 500%.

Figure 3A:
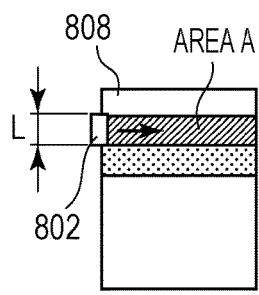
FIGS. 3A to 3E are schematic diagrams for describing operations in which the printer forms an uneven layer and an image layer.
Figure 3B:
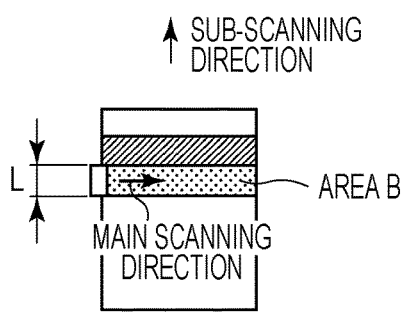

FIGS. 3A to 3E are diagrams for describing operations for forming an uneven layer and an image layer by the recording head scanning the recording medium 808. A main scan is performed by the carriage 802 to form a layer having a width equal to the width L of the recording head, and the recording medium 808 is conveyed in the sub-scanning direction by a distance equal to L each time recording for one line is completed. Here, one line is an area for which recording is performed in a single scan. In order to simplify description, it is assumed that the printer 12 according to this embodiment can discharge an ink for an amount of ink of 100% at the maximum in a single scan and that, in a case of forming a layer for which the amount of ink exceeds 100%, the same area is scanned a plurality of times without conveyance. For example, in a case where the amount of ink to be ejected is 500% at the maximum, the same line is scanned five times. Referring to FIGS. 3A and 3B, the area A is scanned by the recording head five times (FIG. 3A), and thereafter, the recording medium 808 is conveyed in the sub-scanning direction, and a main scan of the area B is repeated five times (FIG. 3B).

Figure 3C:
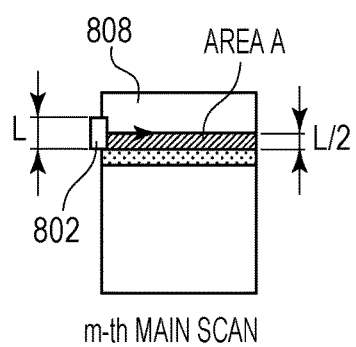
Figure 3D:
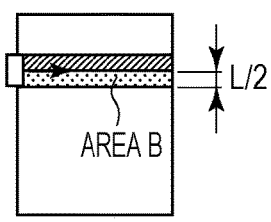
Figure 3E:
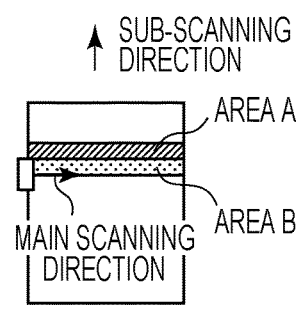

In order to suppress degradation in image quality, such as cyclic non-uniformity, caused by the driving precision of the recording head, multipath printing in which a plurality of scans are performed may be performed even when the amount of ink does not exceed 100%. FIGS. 3C to 3E illustrate an example of two-path printing. In this example, a main scan is performed by the carriage 802 to form an image having a width equal to the width L of the recording head, and the recording medium 808 is conveyed in the sub-scanning direction by a distance equal to L/2 each time recording for one line is completed. Recording for the area A is performed in an m-th main scan (FIG. 3C) and an (m+1)-th main scan (FIG. 3D) by the recording head, and recording for the area B is performed in the (m+1)-th main scan (FIG. 3D) and an (m+2)-th main scan (FIG. 3E) by the recording head. The operation of two-path recording is described here; however, the number of paths for recording may be changed in accordance with desired precision. In a case of performing n-path recording, for example, the recording medium 808 is conveyed in the sub-scanning direction by a distance equal to L/n each time recording for one line is completed. In this case, even when the amount of ink does not exceed 100%, the printing pattern is divided into a plurality of printing patterns, and n main scans are performed by the recording head on the same line of the recording medium to thereby form an uneven layer and an image layer. In this embodiment, in order to avoid confusion of scans in the above-described multipath printing and scans for ejecting an ink of 100% or more, description is given under the assumption that multi-path printing is not performed and that a plurality of scans are performed in order to overlay layers. Note that the recording medium is not limited to a specific recording medium, and various materials, such as paper or a plastic film, can be used as long as an image can be formed by the recording head.

Figure 4:
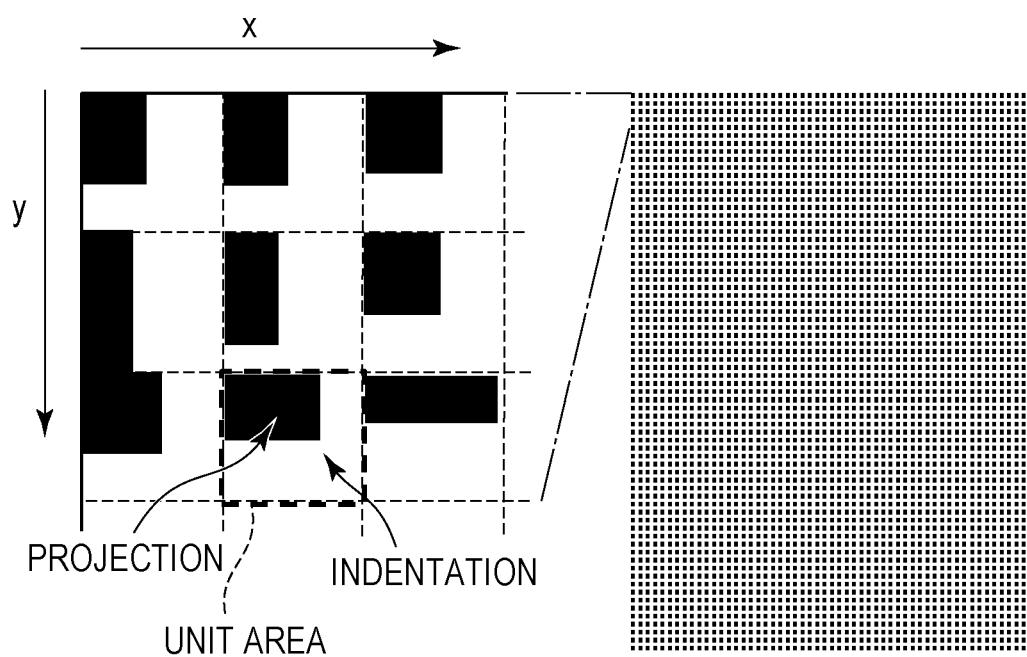
FIG. 4 is a schematic diagram for describing an uneven layer.

FIG. 4 is a schematic diagram for describing an uneven layer and an image layer formed by the printer 12. FIG. 4 illustrates amount-of-CL-ink data. Unit areas represented by broken lines are cyclically arranged, and each unit area is constituted by a projection (an area to which the CL ink is discharged) and an indentation (an area to which the CL ink is not discharged). The unit areas can be cyclically arranged on the basis of an idea similar to that of general dot screens and can be arranged at any angle other than the illustrated angle. Further, the height of the projection can have a different value depending on the position.

FIG. 5 is a schematic diagram illustrating amount-of-CL-ink data and amount-of-colored-ink data as a cross-sectional structure. In this embodiment, it is assumed that the printer resolution is 600 dpi and that the width of one dot is 40 µm. A unit area having an 8-dot width is repeatedly arranged, and therefore, one structure is approximately 320 µm in width. Further, in this embodiment, the thickness of one layer is 15 µm, and the height of each projection is controlled by changing the number of dots that are overlaid. On the surface of the uneven layer, an image layer is formed. In this embodiment, in order to simplify description, the thickness of the image layer is not taken into consideration. Such a minute uneven layer and image layer have little chance of being visually recognized by a viewer and look like a piece of flat printed material, such as a piece of paper or a cloth.

FIG. 6 is a schematic diagram illustrating an example cross-sectional structure of a piece of printed material output from the printer 12 on the basis of the amount-of-ink data illustrated in FIG. 5. In a process of forming an uneven layer by the printer 12, a discharged CL ink wets a recording medium and spreads in the surface direction during a period from landing to curing by UV irradiation. Therefore, formed projections and indentations have a smooth form in the end, as illustrated in FIG. 6. Note that, the projection-indentation form illustrated in FIG. 6 is an example, and a projection-indentation form close to that illustrated in FIG. 5 can be formed by using, for example, a high-viscosity ink that is less likely to exhibit wettability.

Figure 7B:
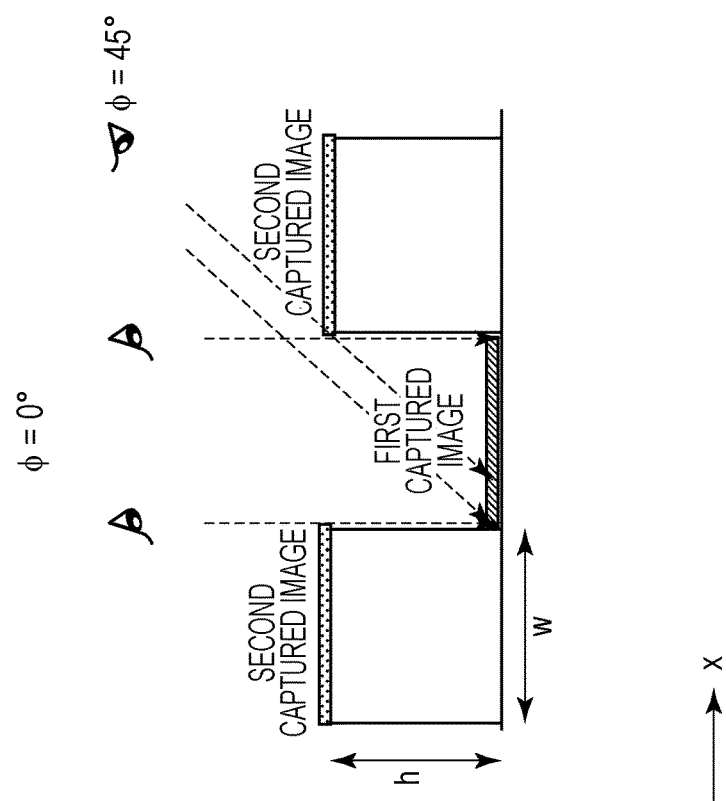
FIGS. 7A and 7B are schematic diagrams for describing a mechanism with which a piece of formed printed material exhibits elevation angle anisotropy.
Figure 7A:
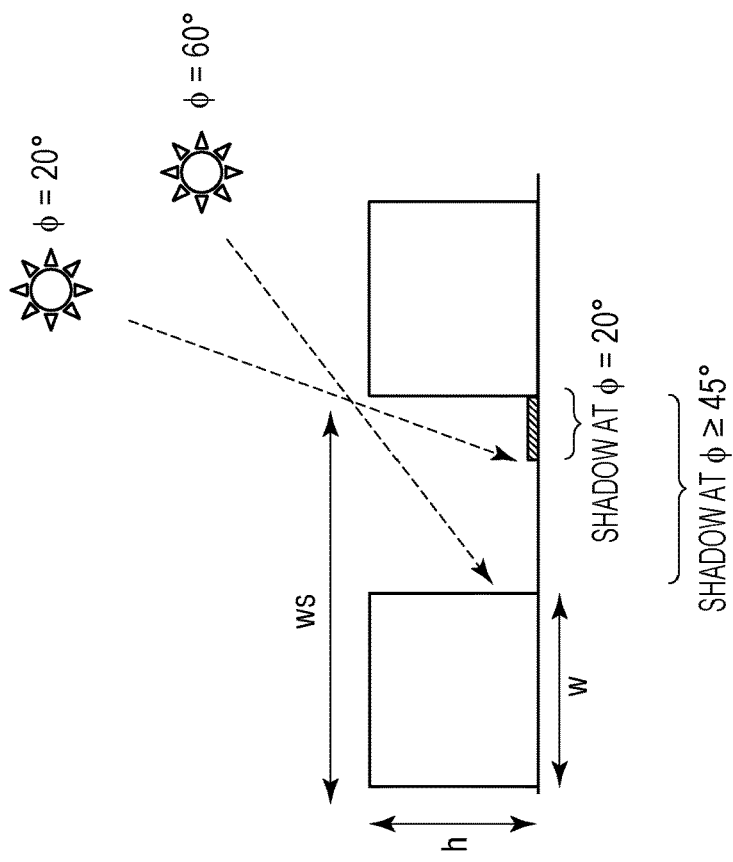
Figure 17A:
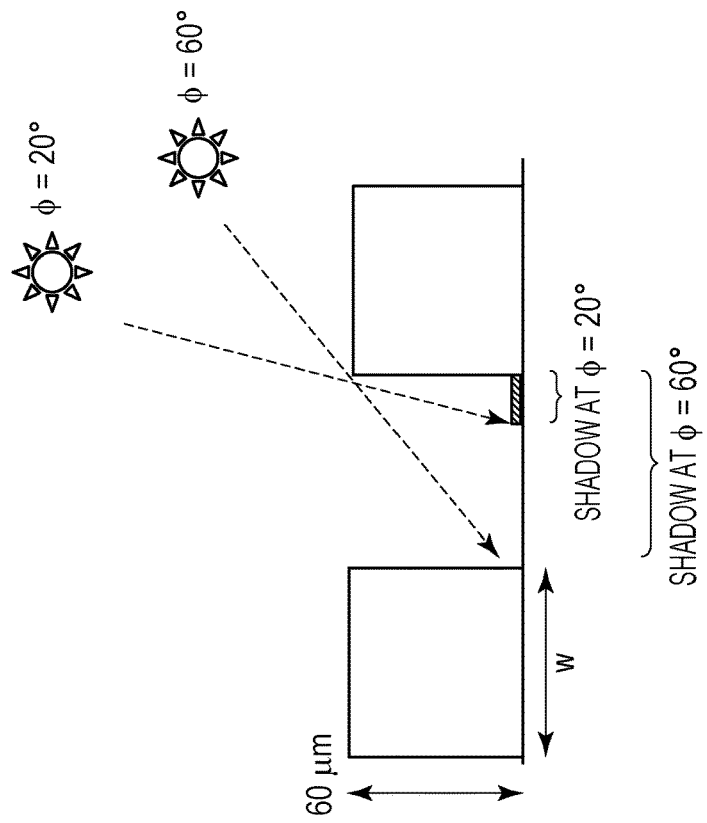
FIGS. 17A and 17B are diagrams for describing a change in the area of a shadow in accordance with a change in the height of a formed projection.
Figure 17B:
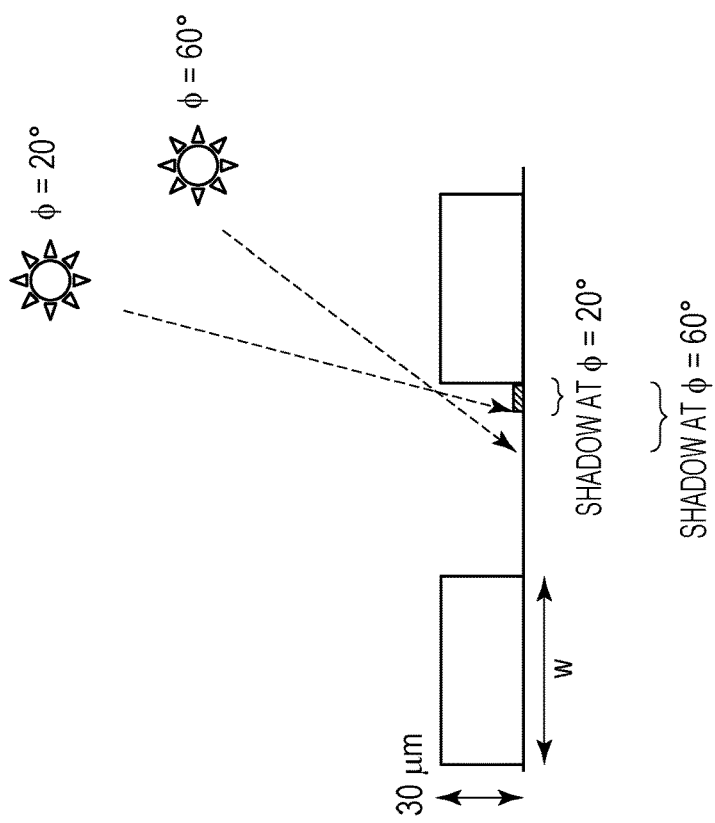

FIGS. 7A and 7B are schematic diagrams for describing a mechanism with which a piece of printed material formed in accordance with this embodiment exhibits anisotropy. The angle of illumination and the angle of view can be expressed by the azimuth angle $\theta$ and the elevation angle $\phi$. In this embodiment, description is given under the assumption that a direction parallel to the x axis in FIGS. 7A and 7B corresponds to the azimuth angle $\theta$ equal to 0°. FIG. 7A is a schematic diagram for describing a shadow produced when the elevation angle $\phi$ of the position of illumination changes. It is assumed that the height h of the projections illustrated in FIG. 7A is half the width ws of the unit area. In a case where the elevation angle $\phi$ of the position of illumination is 0°, light illuminates both the projection and the indentation within the unit area, and therefore, no shadow is produced. If the elevation angle $\phi$ of the position of illumination exceeds 0°, a shadow is produced. If the elevation angle $\phi$ of the position of illumination exceeds 45°, the entire indentation is shaded. Such a change in the area of a shadow is recognized as elevation angle anisotropy. Accordingly, in this embodiment, the height h of the projection within each unit area is controlled to thereby control elevation angle anisotropy of printed materials. FIGS. 17A and 17B are diagrams for describing a change in the area of a shadow in accordance with a change in the height of projections formed in this embodiment. FIG. 17A is a diagram of a case where the height of the projections corresponds to two dots (30 µm), and FIG. 17B is a diagram of a case where the height of the projections corresponds to four dots (60 µm). As illustrated in FIGS. 17A and 17B, the area of a produced shadow changes as the height of the projections changes, and therefore, elevation angle anisotropy can be controlled by controlling the height of the projections.

Figure 8:
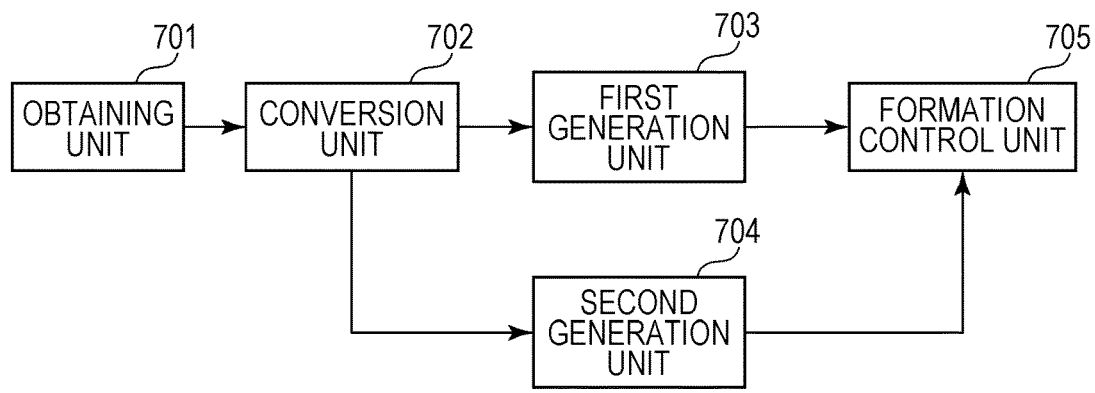
FIG. 8 is a block diagram illustrating a functional configuration of at least one embodiment of an image processing apparatus.
Figure 9:
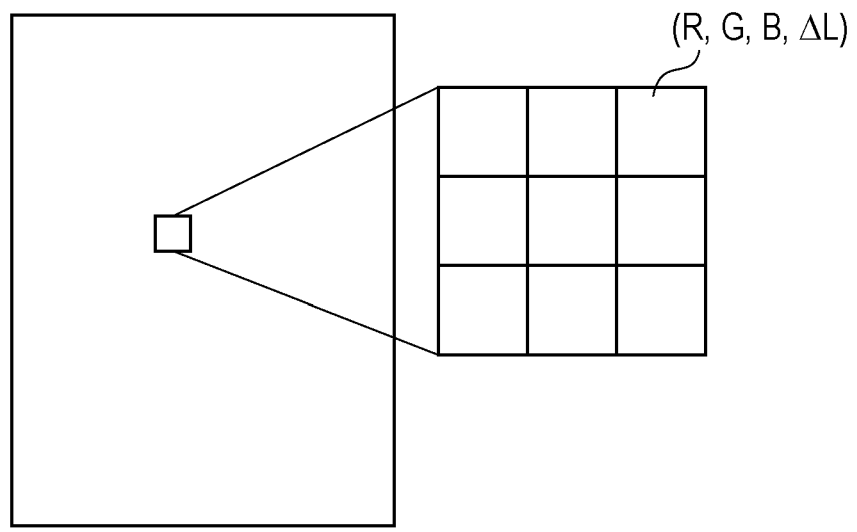
FIG. 9 is a schematic diagram illustrating a structure of image data.

FIG. 8 is a block diagram illustrating a functional configuration of the image processing apparatus 1 according to this embodiment. An obtaining unit 701 obtains image data that includes color information indicating the color of an image and amount-of-brightness-change information regarding the amount of change in brightness when the angle of view related to the azimuthal direction is changed, the amount-of-brightness-change information being served as information regarding anisotropy. FIG. 9 is a schematic diagram illustrating a structure of image data obtained by the obtaining unit 701. The image data is based on any resolution, and the color information and the amount-of-brightness-change information are recorded to four different channels. In the first to third channels, RGB values representing the color information regarding a reproduction target object are stored. Here, it is assumed that the RGB values are defined on the basis of the sRGB standard. Alternatively, RGB values defined by Adobe RGB or L*a*b* values defined by CIE Lab can be used. In the fourth channel, the amount of brightness change ΔL when a reproduction target object is viewed under different geometric conditions is stored.

Figure 10:
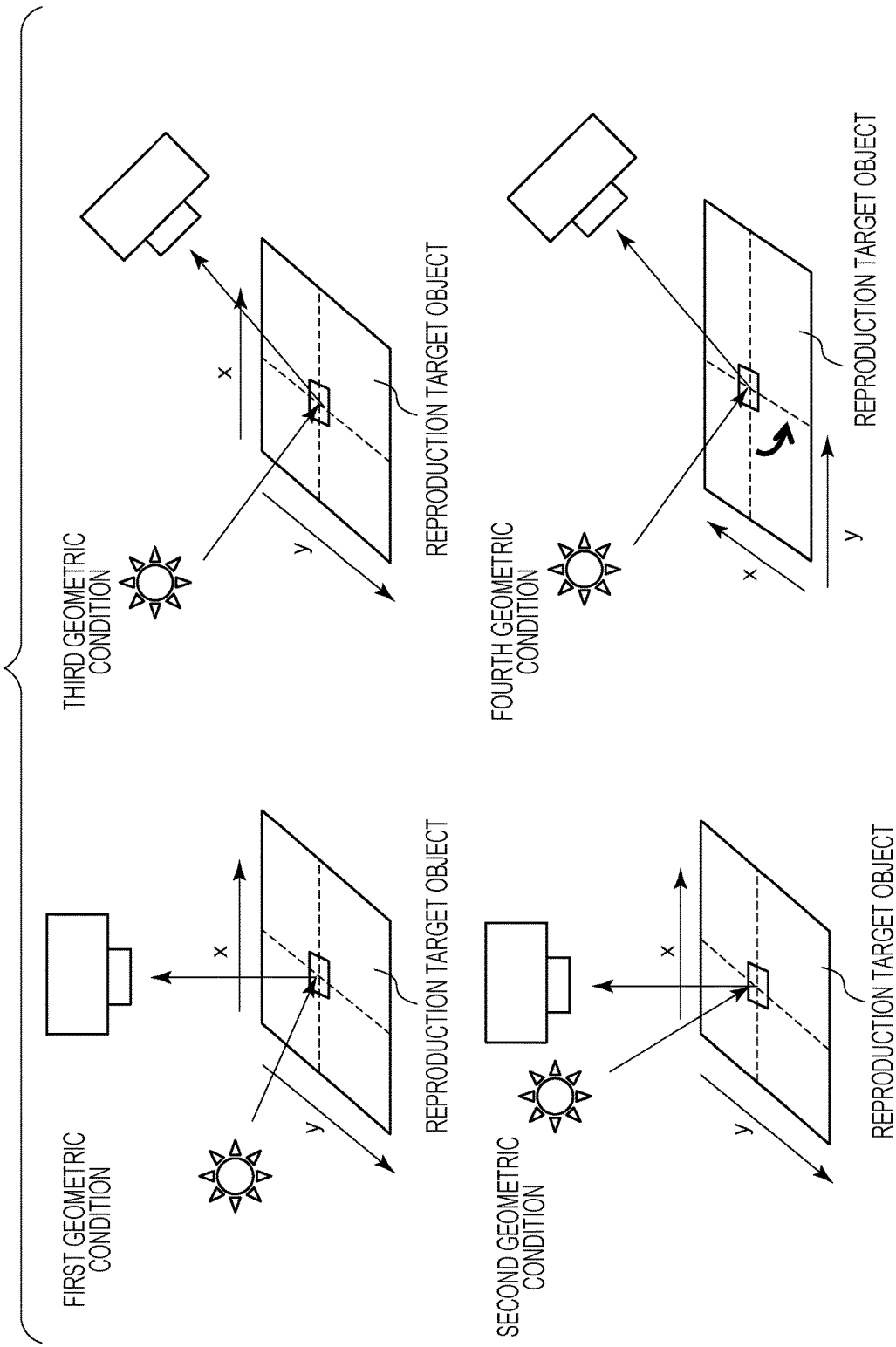
FIG. 10 includes schematic diagrams illustrating cases where an image of a reproduction target object is captured under a plurality of different geometric conditions.

Now, an example of generation of image data is described. FIG. 10 includes schematic diagrams illustrating cases where an image of a reproduction target object is captured under a plurality of different geometric conditions. First, the RGB values of first image capture data obtained by capturing an image under a first geometric condition that the angle of view ϕ is equal to 0° and the angle of illumination φ is equal to 60° can be used as the RGB values stored in the first to third channels of image data that is obtained by the obtaining unit 701. Subsequently, as a second geometric condition, only the angle of illumination φ is changed to 20°, and an image of the reproduction target object is captured to obtain second image capture data. A difference in brightness between the second image capture data and the first image capture data is obtained for each pixel to thereby obtain the amount-of-brightness-change information. In this embodiment, regarding the brightness, the RGB values of the first image capture data are converted to L*a*b* values defined in the CIE Lab space for each pixel, and the L* value is assumed to be a brightness $L_{\phi=60}°$ of the first image capture data. Further, the RGB values of the second image capture data are converted to L*a*b* values defined in the CIE Lab space for each pixel, and the L* value is assumed to be a brightness $L_{\phi=20}°$ of the second image capture data. Then, calculation expressed by equation (1) is performed. The amount of brightness change ΔL, which is the difference between the brightness $L_{\phi=60}°$ and the brightness $L_{\phi=20}°$, is stored in the fourth channel in the image data.

$$\Delta L = L_{\phi=60°} - L_{\phi=20°} \quad \text{equation (1)}$$

In this embodiment, the amount of brightness change ΔL as described above is used. Alternatively, the brightness ratio $L_{\phi=60}°/L_{\phi=20}°$ or the amount of change in the average RGB values expressed by equation (2), for example, can be used.

$$\Delta \overline{RGB} = \overline{RGB}_{\phi=60°} - \overline{RGB}_{\phi=20°} \quad \text{equation (2)}$$

Here, the horizontal bar sign above "RGB" is used to represent the average RGB values. Alternatively, a method may be employed in which the first image capture data and the second image capture data are data to be obtained, and conversion to the amount of brightness change ΔL is performed by performing an arithmetic operation performed within the apparatus by using the above-described method.

Referring back to FIG. 8, a conversion unit 702 performs a resolution conversion process on the R, G, B, and ΔL values stored for each pixel in the image data obtained by the obtaining unit 701 and converts the image data to image data based on the same resolution as the printer resolution of the printer 12. The R, G, B, and ΔL values after the resolution conversion process are respectively represented by R', G', B', and ΔL'. In the resolution conversion process, a publicly known method, such as the nearest neighbor method or the bilinear method, can be used.

A first generation unit 703 generates amount-of-colored-ink data that indicates the amounts of CMYK inks used in printing from the R'G'B' values after the resolution conversion. Conversion from RGB values to CMYK values can be performed by using a publicly known conversion method using an LUT.

A second generation unit 704 uses the ΔL' value after the resolution conversion to generate amount-of-CL-ink data that indicates the amount of CL ink for forming the projection within each unit area. As described above, this embodiment assumes that the printer resolution is 600 dpi and that the width of one dot is 40 µm. In this embodiment, description is given under the assumption that the depth ds and the width ws of each unit area each correspond to eight dots. Such dots correspond to dots based on a screen angle of 0° and a screen ruling of 75 lpi. The projection within each unit area according to this embodiment is a rectangular parallelepiped having the width w corresponding to four dots, the depth d corresponding to eight dots, and the height h in terms of data. The second generation unit 704 calculates $\Delta L'_{ave}$, which is the average ΔL', for each unit area and calculates the length ratio between the height h of the projection and the width ws of the unit area (hereinafter referred to as the height/width ratio) by using the LUT illustrated in FIG. 11A. The height/width ratio obtained from the LUT in FIG. 11A and the width and depth of the projection are used to determine the amount of CL ink. The LUT can be created by forming a plurality of projections having different height/width ratios on a recording medium and measuring the brightness in advance.

A formation control unit 705 instructs the printer 12 to form an uneven layer and an image layer on the basis of the amount-of-colored-ink data and the amount-of-CL-ink data.

FIGS. 13A and 13B illustrate data of example unit areas in the amount-of-CL-ink data generated on the basis of the height/width ratio calculated by using the LUT illustrated in FIG. 11A. FIG. 13A illustrates an example in a case of a height/width ratio of 1:8, and FIG. 13B illustrates an example in a case of a height/width ratio of 1:4. Note that, in the examples in FIGS. 13A and 13B, the projection among the projection and the indentation is left-aligned within the unit area; however, the projection may be right-aligned or center-aligned. Further, the amount-of-CL-ink data according to this embodiment is generated on the basis of the height/width ratio; however, the amount-of-CL-ink data may be stored in advance in a storage device, such as the HDD 103, and the amount-of-CL-ink data that is associated with the height/width ratio may be obtained. The formation control unit 705 instructs the printer 12 to form an uneven layer on the basis of the amount-of-CL-ink data received from the second generation unit 704 by using a CL ink. The formation control unit 705 performs a publicly known path decomposition process and half-tone process on the basis of the amount-of-colored-ink data received from the first generation unit 703 and instructs the printer 12 to form an image layer on the uneven layer formed earlier by using colored inks.

Figure 14A:
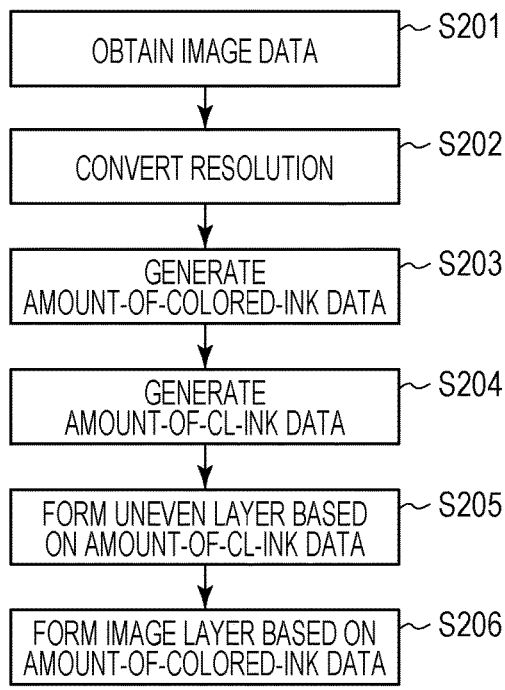
FIGS. 14A and 14B are flowcharts illustrating operations of at least one embodiment of an image processing apparatus.

FIG. 14A is a flowchart representing the flow of a process performed by the image processing apparatus 1 according to this embodiment. Hereinafter, each step is represented by a corresponding reference numeral including "S" as a prefix.

In S201, the obtaining unit 701 obtains image data that includes, for each pixel, color information, namely, R, G, and B values, regarding a reproduction target object and amount-of-brightness-change information ΔL, which represents elevation angle anisotropy of the reproduction target object, and outputs the R, G, B, and ΔL values to the conversion unit 702. In S202, the conversion unit 702 performs a resolution conversion process on the R, G, B, and ΔL values, calculates R', G', B', and ΔL' values, and outputs the R', G', and B' values to the first generation unit 703 and the ΔL' value to the second generation unit 704.

In S203, the first generation unit 703 generates amount-of-colored-ink data that indicates the amounts of CMYK inks from the R', G', and B' values and outputs the amount-of-colored-ink data to the printer 12. In S204, the second generation unit 704 obtains a $\Delta L'_{ave}$ value by calculating the average ΔL' value for each unit area and calculates the height/width ratio h/ws of the unit area from the $\Delta L'_{ave}$ value. The second generation unit 704 generates amount-of-CL-ink data that indicates the amount of CL ink for forming an uneven layer on the basis of the calculated h/ws ratio and outputs the amount-of-CL-ink data to the printer 12.

In S205, the formation control unit 705 instructs the printer 12 to form an uneven layer using a CL ink on the basis of the amount-of-CL-ink data. In S206, the formation control unit 705 instructs the printer 12 to form an image layer using colored inks on the uneven layer formed in S205 on the basis of the amount-of-colored-ink data.

As a consequence, a piece of printed material on which a plurality of unit areas each having a projection are arranged can be formed such that the height of each projection and the arrangement cycle of the unit areas change in accordance with the amount of brightness change, and the piece of formed printed material exhibits desired anisotropy. Further, the form of the structure is controlled by using only the height/width ratio h/ws, and therefore, the arithmetic operation is easy and the projection-indentation form can be flexibly formed for any screen ruling, which is an advantage.

A printer that employs a UV-curing inkjet method, for example, is assumed to be the printer 12; however, a printer that employs an electrophotographic method, for example, may be used as long as the printer can form an uneven layer and an image layer in accordance with the generated amount-of-ink data.

In this embodiment, as the image data to be obtained, image data that includes color information and amount-of-brightness-change information regarding the amount of change in brightness when the angle of view is changed is obtained; however, the image data to be obtained is not limited to the above-described data. First image data that indicates color information obtained under a certain geometric condition (for example, the angle of illumination $\phi$ is equal to 60°) and second image data that indicates color information obtained under a geometric condition different from that for the first image data (for example, the angle of illumination $\phi$ is equal to 20°) may be separately obtained, and the amount of brightness change when the geometric condition changes may be calculated. On the basis of the calculated amount of brightness change, amount-of-CL-ink data is generated. In this case, image data used to generate amount-of-colored-ink data may be generated by selecting and using one of the first image data and the second image data or by performing an arithmetic operation, such as calculating and using the average of the two pieces of image data.

In this embodiment, the L* value calculated from the RGB values is used as the brightness; however, the reflection intensity (reflectance) of the spectral radiance relative to incident light obtained by a measuring instrument, for example, may be used.

In this embodiment, the difference in brightness is used as the amount of brightness change; however, the amount of brightness change is not limited to this. For example, the brightness ratio, for example, may be used as the amount of brightness change.

In this embodiment, in order to obtain the height/width ratio, the LUT in which the average amount of brightness change is associated with the height/width ratio is used; however, the LUT to be used is not limited to the above-described LUT. Information regarding brightness under a plurality of different geometric conditions (brightness information) needs to be associated with the height/width ratio. For example, an LUT in which the brightness under the first geometric condition (the angle of illumination $\phi$ is equal to 60°) and the brightness under the second geometric condition (the angle of illumination $\phi$ is equal to 20°) are associated with the height/width ratio may be used.

In this embodiment, as recording material for recording to a recording medium, colored inks and a CL ink are used; however, the recording material is not limited to the above-described inks. Colored colorants, such as colored toners, can be used instead of the colored inks. Further, recording material, such as a colorless white ink or a CL toner, can be used instead of the CL ink.

In this embodiment, the height/width ratio h/ws is used to determine the form of each projection; however, one of the height h of the projection and the width ws of the unit area may be set to a fixed value, and the other may be used to determine the form of the projection or the cycle on the basis of which the projections are formed.

Second Embodiment

In the first embodiment, the example is described where observation at the azimuth angle $\theta$ equal to 0° is assumed to be the reference and where image data includes a difference in brightness observed due to a change in the elevation angle. In this embodiment, a method for controlling elevation angle anisotropy at a desired angle by using image data that includes, for each pixel, the angle of view related to the azimuth angle direction is described. Note that the configuration and operation of the image processing apparatus 1 according to this embodiment are the same as those described in the first embodiment unless otherwise specifically described, and therefore, description thereof is omitted.

The flow of a process performed by the image processing apparatus 1 according to this embodiment is described with reference to FIG. 14A.

In S201, the obtaining unit 701 obtains image data that includes, for each pixel, color information, namely, R, G, and B values, regarding a reproduction target object, the azimuth angle $\theta$ of a position at which the reproduction target object viewed looks brightest, and the amount of brightness change $\Delta L$ related to the elevation angle direction, the amount of brightness change $\Delta L$ representing a difference between the brightness observed from the position at which the reproduction target object looks brightest and the brightness observed from a position at which the reproduction target object looks darkest. In the image data, the R, G, B, $\theta$, and $\Delta L$ values are respectively recorded to five different channels. The obtaining unit 701 outputs the R, G, B, $\theta$, and $\Delta L$ values to the conversion unit 702. Regarding the azimuth angle $\theta$, an image of the reproduction target object needs to be captured under a plurality of geometric conditions in which the azimuth angle is changed by 15°, and the azimuth angle in a condition under which the brightness L is largest needs to be stored for each pixel.

In S202, the conversion unit 702 performs a resolution conversion process on the R, G, B, $\theta$, and $\Delta L$ values and calculates R', G', B', $\theta'$, and $\Delta L'$ values. Then, the conversion unit 702 outputs the R', G', and B' values to the first generation unit 703 and the $\theta'$ and $\Delta L'$ values to the second generation unit 704. In a case of converting a plurality of viewing directions $\theta$ at a high resolution to those at a low resolution, the average angle of each direction simply needs to be calculated. On the contrary, in a case of conversion from directions at a low resolution to those at a high resolution, a publicly known method, such as the nearest neighbor method, needs to be used.

In S203, the first generation unit 703 generates amount-of-colored-ink data that indicates the amounts of CMYK inks from the R', G', and B' values and outputs the amountof-colored-ink data to the printer 12. In S204, the second generation unit 704 obtains a $\Delta L'_{ave}$ value and a $\theta'_{ave}$ value by calculating the average $\Delta L'$ value and the average $\theta'$ value for each unit area and calculates the height/width ratio h/ws from the $\Delta L'_{ave}$ value. The second generation unit 704 generates amount-of-CL-ink data that indicates the amount of CL ink for forming an uneven layer on the basis of the calculated $\theta'_{ave}$ value and h/ws ratio and outputs the amount-of-CL-ink data to the printer 12. FIG. 15 includes schematic diagrams illustrating amount-of-CL-ink data generated on the basis of the $\theta'_{ave}$ value and the h/ws ratio. A plurality of patterns that involve the h/ws ratio and the $\theta'_{ave}$ value are created in advance and stored in a memory. FIG. 15 includes a group of patterns that correspond to an h/ws ratio of 1/8. The group of patterns is formed of a plurality of patterns that correspond to the respective $\theta'_{ave}$ values, and the amount-of-CL-ink data that corresponds to the calculated $\theta'_{ave}$ value is selected.

In S205, the formation control unit 705 instructs the printer 12 to perform printing and form an uneven layer using a CL ink on the basis of the amount-of-CL-ink data. In S206, the formation control unit 705 instructs the printer 12 to form an image layer using colored inks on the formed uneven layer on the basis of the amount-of-colored-ink data.

As described above, the image processing apparatus 1 according to this embodiment obtains the viewing direction as the image data to be obtained and controls the orientation of the projection within each unit area to thereby obtain printed materials for which anisotropy is controlled at a desired angle.

Third Embodiment

In the above-described embodiments, the method for forming printed materials for which elevation angle anisotropy is controlled is described. In this embodiment, a method for forming printed materials for which azimuthal anisotropy is also controlled is described. Note that the configuration and operation of the image processing apparatus 1 according to this embodiment are the same as those described in the first embodiment unless otherwise specifically described, and therefore, description thereof is omitted.

Figure 16A:
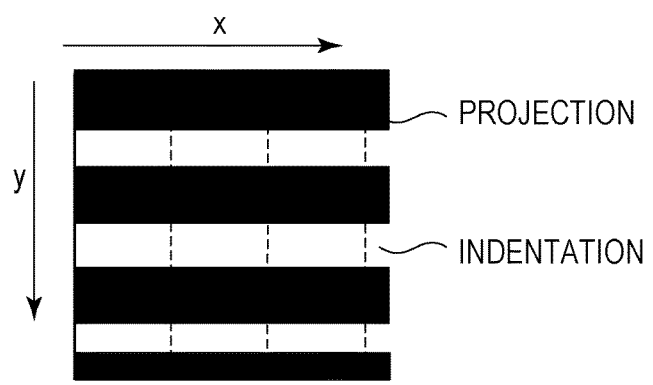
FIGS. 16A to 16C are schematic diagrams for describing a mechanism with which a piece of formed printed material exhibits azimuthal anisotropy.
Figure 16B:
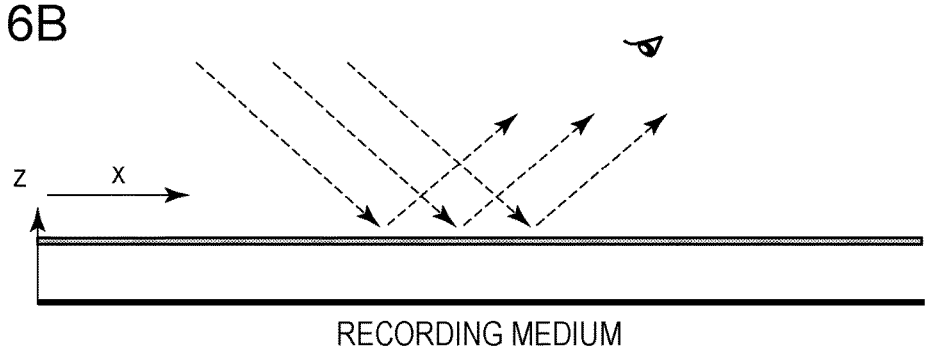
Figure 16C:
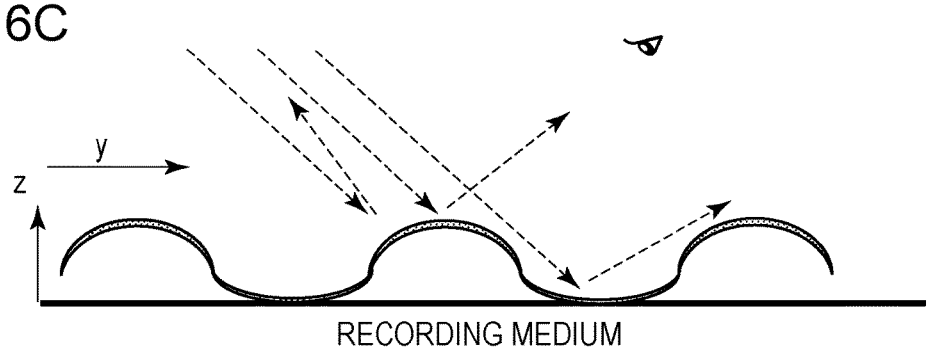

FIGS. 16A to 16C are schematic diagrams for describing a mechanism with which a piece of printed material formed in accordance with this embodiment exhibits azimuthal anisotropy. FIG. 16A illustrates an example pattern of a projection-indentation form when a piece of printed material is viewed from immediately above (at a position corresponding to an elevation angle of 90°), and FIGS. 16B and 16C are schematic diagrams for describing how the pattern illustrated in FIG. 16A looks when viewed from a position corresponding to an elevation angle of 45°. It is assumed that the x direction of a piece of printed material corresponds to the azimuth angle $\theta$ equal to 0°. Then, FIG. 16B is a diagram of a case where the pattern illustrated in FIG. 16A is viewed in a direction parallel to the x direction, that is, a case where the pattern is viewed at the azimuth angle $\theta$ equal to 0°, and FIG. 16C is a diagram of a case where the pattern is viewed at the azimuth angle $\theta$ equal to 90°. In a case where the angle of illumination and the angle of view have a relationship of regular reflection relative to the surface of a recording medium, the pattern looks dark when viewed from the position illustrated in FIG. 16C because the amount of light observed is smaller than that in FIG. 16B due to variations in the direction of reflection caused by projections and indentations and due to the effect of shadows. In this embodiment, azimuthal anisotropy of printed materials is controlled by using such a mechanism.

The flow of a process performed by the image processing apparatus 1 according to this embodiment is described with reference to FIG. 14A.

In S201, the obtaining unit 701 obtains image data that includes, for each pixel, color information, namely, R, G, and B values, regarding a reproduction target object, amount-of-brightness-change information $\Delta L\phi$ related to the elevation angle, and amount-of-brightness-change information $\Delta L\theta$ related to the azimuth angle, and outputs the R, G, B, $\Delta L\phi$, and $\Delta L\theta$ values to the conversion unit 702. The amount of brightness change related to the azimuth angle is obtained as in the first embodiment. The amount of brightness change $\Delta L\phi$ related to the elevation angle can be obtained by changing the position of illumination, specifically, the elevation angle direction of illumination, and capturing an image, as illustrated by a third geometric condition and a fourth geometric condition in FIG. 10. As the amount of brightness change related to the elevation angle in this embodiment, a difference between the brightness $L\phi_1$ observed when the elevation angle is equal to 60° ($\phi_1$) and the brightness $L\phi_2$ observed when the elevation angle is changed to 20° ($\phi_2$) while the azimuth angle $\theta$ of the position of illumination is fixed to 0° is used.

In S202, the conversion unit 702 performs a resolution conversion process on the R, G, B, $\Delta L\theta$, and $\Delta L\phi$ values and calculates R', G', B', $\Delta L\theta'$, and $\Delta L\phi'$ values. The conversion unit 702 outputs the R', G', and B' values to the first generation unit 703 and the $\Delta L\theta'$ and $\Delta L\phi'$ values to the second generation unit 704.

In S203, the first generation unit 703 generates amount-of-colored-ink data that indicates the amounts of CMYK inks from the R', G', and B' values and outputs the amount-of-colored-ink data to the printer 12.

In S204, the second generation unit 704 obtains a $\Delta L\theta'_{ave}$ value by calculating the average $\Delta L\theta'$ value for each unit area and calculates the width/depth ratio (aspect ratio) w/d of the base of the projection in the unit area from the $\Delta L\theta'_{ave}$ value by using the LUT illustrated in FIG. 11B.

Now, a relationship between $\Delta L\theta'_{ave}$ and the form of the projection is described. FIG. 12A is a schematic diagram illustrating a relationship between the amount of brightness change $\Delta L\theta'_{ave}$, which represents the degree of anisotropy, and the width/depth ratio of the projection within a unit area according to this embodiment. As described with reference to FIGS. 16A to 16C, anisotropy develops due to variations in the direction of reflection caused by projections and indentations or a change in the shadows that occur when the angle of view changes. In a case where the central pattern illustrated in FIG. 12A is repeatedly arranged, projections and indentations viewed at the azimuth angle $\theta$ equal to 0° are the same as those viewed at the azimuth angle $\theta$ equal to 90°, and therefore, anisotropy does not develop. That is, in a case where $\Delta L$ is equal to 0, it is appropriate to use this pattern. With the leftmost pattern illustrated in FIG. 12A, a large number of projections and indentations are viewed at the azimuth angle $\theta$ equal to 0° while a small number of projections and indentations are viewed at the azimuth angle $\theta$ equal to 90°. That is, regarding the brightness, $L_{\theta=90}° > L_{\theta=0}°$ is satisfied. Therefore, if the value of $\Delta L$ is a large positive value, it is appropriate to use a pattern close to the leftmost pattern. On the contrary, it is appropriate to use the rightmost pattern illustrated in FIG. 12A in a case where the value of $\Delta L$ is a large negative value.

Further, the second generation unit 704 obtains a $\Delta L\phi'_{ave}$ value by calculating the average $\Delta L\phi'$ value for each unit area and calculates the height h of the projection on the basis of a relationship between the $\Delta L\phi'_{ave}$ value and the area ratio A of a shadow that changes in accordance with a change in the elevation angle. Specifically, the area ratio A is the ratio of the shaded area relative to the non-shaded area within the unit area and can be expressed by equation (3) below.

$$A = \frac{h \cdot \{\tan(\phi_2) - \tan(\phi_1)\} \cdot d}{ds \cdot ws} \qquad \text{equation (3)}$$

Here, the denominator is the area of one unit area, and the numerator is a change in the area of a shadow in accordance with a change in the elevation angle. The relationship between the $\Delta L\phi'$ value and the area ratio A needs to be measured in advance and held. FIG. 11C illustrates an example LUT that indicates the relationship between the $\Delta L\phi'_{ave}$ value and the area ratio A of the shadow. In the first embodiment, the width w and the depth d of the projections are fixed, and therefore, the height h can be easily obtained from the $\Delta L\phi'$ value through conversion. In this embodiment, however, the width w and the depth d of the projections are variable, and therefore, the value processed as h/ws in the LUT is replaced by the area ratio A of a changing shadow, and the height h is calculated. The height h of the projection within each unit area is calculated on the basis of the example LUT illustrated in FIG. 11C and the relationship between the area ratio A and the height h expressed by equation (4).

$$h = \frac{A \cdot ds \cdot ws}{\{\tan(\phi_2) - \tan(\phi_1)\} \cdot d} \qquad \text{equation (4)}$$

Then, the second generation unit 704 generates amount-of-CL-ink data that indicates the amount of CL ink for forming an uneven layer on the basis of the calculated w/d ratio and height h and outputs the amount-of-CL-ink data to the printer 12.

In S205, the formation control unit 705 instructs the printer 12 to perform printing and form an uneven layer using a CL ink on the basis of the amount-of-CL-ink data. In S206, the formation control unit 705 instructs the printer 12 to form an image layer using colored inks on the formed uneven layer on the basis of the amount-of-colored-ink data.

As described above, the image processing apparatus 1 according to this embodiment obtains the image data that includes, for each pixel, the amount of brightness change related to the azimuth angle and also controls the width and depth of the projection within each unit area to thereby obtain printed materials for which azimuthal anisotropy as well as elevation angle anisotropy is controlled.

In this embodiment, the projection within each unit area is in the form of a rectangular parallelepiped; however, a solid body, such as a quadrangular pyramid, a roof form, or a semi-cylindrical form, having a base in a shape, such as a rectangular, that can be defined by the width w and the depth d can be used. If the width and depth are respectively replaced by the base and height of a triangle, the projection can be in the form of a triangular pyramid or a triangular prism, for example.

In a case where anisotropy need not be reproduced, a projection is not formed as in the central pattern illustrated in FIG. 12B, for example.

In a case where projections and indentations can be formed at a high resolution, a circular cylinder, a circular cone, or a hemisphere that has a base in a circle shape or an oval shape, as illustrated in FIG. 12C, can be used. In this case, the width/depth ratio w/d can be used or the roundness, for example, can be alternatively used.

In this embodiment, the width/depth ratio w/d is used to determine the form of each projection; however, one of the width w and depth d may be set to a fixed value, and the other may be used to determine the form of the projection.

Fourth Embodiment

In the third embodiment, the method for forming printed materials that are controlled so as to exhibit azimuthal anisotropy as well as elevation angle anisotropy is described. In this embodiment, a method for forming printed materials for which elevation angle anisotropy related to color is also controlled is described. Note that the configuration and operation of the image processing apparatus 1 according to this embodiment are the same as those described in the third embodiment unless otherwise specifically described, and therefore, description thereof is omitted.

FIG. 7B is a schematic diagram for describing a piece of printed material formed according to this embodiment. In this embodiment, RGB values applied to the image layer on the projection within a unit area are made different from RGB values applied to the image layer on the indentation within the unit area to thereby form a piece of printed material for which the color of the image formed on the recording medium changes in accordance with a change in the angle of view φ related to the elevation angle direction.

Figure 14B:
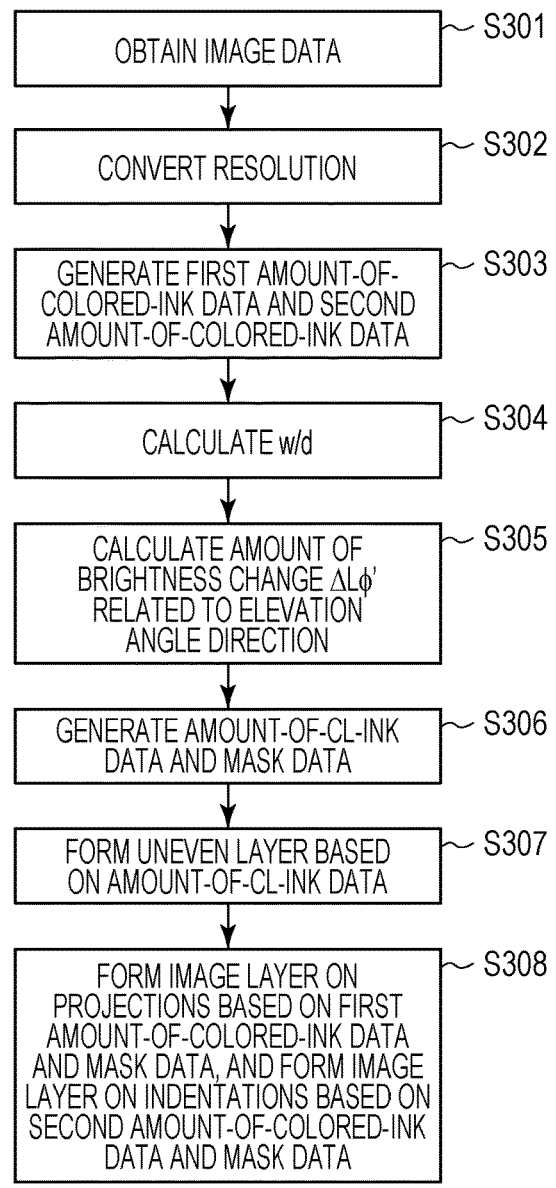

FIG. 14B is a flowchart representing the flow of a process performed by the image processing apparatus 1 according to this embodiment.

In S301, the obtaining unit 701 obtains image data that includes, for each pixel, color information, namely, $R_1$, $G_1$, and $B_1$ values, regarding a reproduction target object for a first angle of view φ1 related to the elevation angle direction, color information, namely, $R_2$, $G_2$, and $B_2$ values, regarding the reproduction target object for a second angle of view φ2 related to the elevation angle direction, and the amount of brightness change ΔLθ related to the azimuth angle. Then, the obtaining unit 701 outputs the $R_1$, $G_1$, $B_1$, $R_2$, $G_2$, $B_2$, and ΔLθ values to the conversion unit 702. In this embodiment, it is assumed that the $R_1$, $G_1$, and $B_1$ values in image capture data (first captured image) obtained by capturing an image at the elevation angle equal to 45° (φ1) and the $R_2$, $G_2$, and $B_2$ values in image capture data (second captured image) obtained by capturing an image at the elevation angle equal to 0° (φ2) are used.

In S302, the conversion unit 702 performs a resolution conversion process on the $R_1$, $G_1$, $B_1$, $R_2$, $G_2$, $B_2$, and ΔLθ values and calculates $R_1'$, $G_1'$, $B_1'$, $R_2'$, $G_2'$, $B_2'$, and ΔLθ' values. Then, the conversion unit 702 outputs the $R_1'$, $G_1'$, $B_1'$, $R_2'$, $G_2'$, and $B_2'$ values to the first generation unit 703 and the $R_1'$, $G_1'$, $B_1'$, $R_2'$, $G_2'$, $B_2'$, and ΔLθ' values to the second generation unit 704. In S303, the first generation unit 703 generates first amount-of-colored-ink data that indicates ink values $C_1$, $M_1$, $Y_1$, and $K_1$ from the $R_1'$, $G_1'$, and $B_1'$ values, generates second amount-of-colored-ink data that indicates ink values $C_2$, $M_2$, $Y_2$, and $K_2$ from the $R_2'$, $G_2'$, and $B_2'$ values, and outputs the first amount-of-colored-ink data and the second amount-of-colored-ink data to the printer 12.

In S304, the second generation unit 704 obtains a ΔLθ'$_{ave}$ value by calculating the average ΔLθ' value for each unit area and calculates the width/depth ratio w/d of the projection in the unit area from the ΔLθ'$_{ave}$ value. In S305, the second generation unit 704 calculates the amount of brightness change $\Delta L\phi'$ related to the elevation angle on the basis of the $R_1'$, $G_1'$, and $B_1'$ values of the first captured image and the $R_2'$, $G_2'$, and $B_2'$ values of the second captured image by using the above-described method.

In S306, the second generation unit 704 calculates the height h of the projection within each unit area from the $\Delta L\phi'$ value as in S204 in the third embodiment. Then, the second generation unit 704 generates amount-of-CL-ink data on the basis of the w/d ratio and the height h and outputs the amount-of-CL-ink data to the printer 12. Further, the second generation unit 704 generates mask data for determining whether a predetermined area within each unit area is a projection area or an indentation area on the basis of the amount-of-CL-ink data and outputs the mask data to the printer 12. In S307, the formation control unit 705 instructs the printer 12 to perform printing and form an uneven layer using a CL ink on the basis of the amount-of-CL-ink data.

In S308, the formation control unit 705 instructs the printer 12 to form an image layer on an area that corresponds to the projections of the uneven layer on the basis of the mask data input from the second generation unit 704 and the first amount-of-colored-ink data. Further, the formation control unit 705 instructs the printer 12 to form an image layer on an area that corresponds to the indentations of the uneven layer on the basis of the mask data input from the second generation unit 704 and the second amount-of-colored-ink data.

Accordingly, in the piece of formed printed material, the area of a visible portion of the image formed on each indentation changes in accordance with the elevation angle at which the image is viewed. As a result, the color of the first captured image and the color of the second captured image are mixed in a ratio that corresponds to the angle of the elevation angle direction, and therefore, elevation angle anisotropy related to color as well as brightness can be controlled.

According to the embodiments of the present disclosure, printed materials having anisotropy can be obtained more easily than before.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-130607, filed Jun. 30, 2016, and Japanese Patent Application No. 2017-050377, filed Mar. 15, 2017, which are hereby incorporated by reference herein in their entireties.

What is claimed is:

1. An image processing apparatus for generating data used to form on a recording medium an uneven layer on which a plurality of unit areas each having a projection are arranged, the image processing apparatus comprising:
   a first brightness information obtaining unit configured to obtain first brightness information regarding a first brightness of a predetermined area of an object observed in a first viewing direction and regarding a second brightness of the predetermined area of the object observed in a second viewing direction, the second viewing direction being a direction having an elevation angle different from an elevation angle of the first viewing direction; and
   a first recording amount data generation unit configured to generate first recording amount data that indicates a recording amount of recording material used to form the uneven layer on the recording medium such that at least one of a width of each of the unit areas and a height of the projection changes in accordance with the first brightness information,
   wherein a change in an area of a shadow to be observed in accordance with a change in an elevation angle of a viewing direction is controlled based on at least one of the width of each of the unit areas and the height of the projection.

2. The image processing apparatus according to claim 1, wherein
   the first brightness information is a difference between the first brightness and the second brightness.

3. The image processing apparatus according to claim 1, wherein
   the first brightness information is the first brightness and the second brightness.

4. The image processing apparatus according to claim 1, wherein
   the second brightness is larger than the first brightness, and
   wherein a brightness observed when the uneven layer is viewed in the second viewing direction is larger than a brightness observed when the uneven layer is viewed in the first viewing direction.

5. The image processing apparatus according to claim 1, wherein
   the second viewing direction is a direction having an elevation angle different from the elevation angle of the first viewing direction and having an azimuth angle equal to an azimuth angle of the first viewing direction.

6. The image processing apparatus according to claim 1, wherein the first recording amount data generation unit generates the first recording amount data such that a ratio between a width of each of the unit areas each having the projection and a height of the projection changes in accordance with the first brightness information.

7. The image processing apparatus according to claim 1, wherein
the projection has a base in a shape that is one of a rectangular shape, a triangular shape, a circular shape, and an ovoidal shape.

8. The image processing apparatus according to claim 1, wherein
the projection is in a form that is one of a rectangular parallelepiped, a quadrangular pyramid, a roof form, a semi-cylindrical form, a triangular prism, a triangular pyramid, a circular cylinder, a circular cone, and a hemisphere.

9. The image processing apparatus according to claim 1, wherein
the first brightness and the second brightness are a reflection intensity or a reflectance relative to light incident on the object.

10. The image processing apparatus according to claim 1, further comprising:
a second brightness information obtaining unit configured to obtain second brightness information regarding a third brightness of the predetermined area of the object observed in a third viewing direction and regarding a fourth brightness of the predetermined area of the object observed in a fourth viewing direction, the fourth viewing direction being a direction having an azimuth angle different from an azimuth angle of the third viewing direction and having an elevation angle equal to an elevation angle of the third viewing direction, wherein
the first recording amount data generation unit generates the first recording amount data based on the second brightness information.

11. The image processing apparatus according to claim 1, further comprising:
an azimuth angle obtaining unit configured to obtain an azimuth angle of the second viewing direction at which the second brightness is larger than the first brightness, wherein
the first recording amount data generation unit generates the first recording amount data, the uneven layer being formed such that an orientation of the projection is rotated by the azimuth angle of the second viewing direction.

12. The image processing apparatus according to claim 1, wherein
the recording material is recording material that cures when irradiated with ultraviolet rays.

13. The image processing apparatus according to claim 1, further comprising:
a first forming unit configured to form the uneven layer on the recording medium by using the recording material based on the first recording amount data.

14. The image processing apparatus according to claim 13, further comprising:
a color information obtaining unit configured to obtain color information indicating a color of the predetermined area of the object observed in the first viewing direction or in the second viewing direction;
a second recording amount data generation unit configured to generate second recording amount data that indicates a recording amount of a colored colorant based on the color information; and
a second forming unit configured to form an image on the uneven layer on the recording medium by using the colored colorant based on the second recording amount data.

15. The image processing apparatus according to claim 14, wherein
the colored colorant is a colored colorant that cures when irradiated with ultraviolet rays.

16. The image processing apparatus according to claim 14, wherein
the second forming unit forms the image on the uneven layer after the first forming unit has formed the uneven layer on the recording medium.

17. The image processing apparatus according to claim 1, further comprising:
a color information obtaining unit configured to obtain first color information indicating a color of the predetermined area of the object observed in the first viewing direction and second color information indicating a color of the predetermined area of the object observed in the second viewing direction;
a mask data generation unit configured to generate, based on a form of the projection, mask data used to determine whether a predetermined area of the uneven layer is a projection;
a first forming unit configured to form the uneven layer on the recording medium by using the recording material based on the first recording amount data; and
a second forming unit configured to form on the projection a first image that represents the color indicated by the first color information based on the mask data by using a colored colorant and to form on an area other than the projection a second image that represents the color indicated by the second color information based on the mask data by using the colored colorant.

18. An image processing method for an image processing apparatus for generating data used to form on a recording medium an uneven layer on which a plurality of unit areas each having a projection are arranged, the image processing method comprising:
an obtaining step of obtaining brightness information regarding a brightness of a predetermined area of an object observed in a first viewing direction and regarding a brightness of the predetermined area of the object observed in a second viewing direction, the second viewing direction being a direction having an elevation angle different from an elevation angle of the first viewing direction; and
a generating step of generating recording amount data that indicates a recording amount of recording material used to form the uneven layer on the recording medium such that at least one of a width of each of the unit areas and a height of the projection changes in accordance with the brightness information,
wherein a change in an area of a shadow to be observed in accordance with a change in an elevation angle of a viewing direction is controlled based on at least one of the width of each of the unit areas and the height of the projection.

19. A non-transitory computer-readable storage medium storing instructions that, when executed by a computer, cause the computer to perform a method comprising:
an obtaining step of obtaining brightness information regarding a brightness of a predetermined area of an object observed in a first viewing direction and regarding a brightness of the predetermined area of the object observed in a second viewing direction, the second viewing direction being a direction having an elevation angle different from an elevation angle of the first viewing direction; and a generating step of generating recording amount data that indicates a recording amount of recording material used to form an uneven layer on a recording medium such that at least one of a width of each unit area and a height of a projection of the unit area changes in accordance with the brightness information, wherein a change in an area of a shadow to be observed in accordance with a change in an elevation angle of a viewing direction is controlled based on at least one of the width of each of the unit areas and the height of the projection.

* * * * *